(12) United States Patent
Venkataramana et al.

(10) Patent No.: US 7,577,895 B2
(45) Date of Patent: Aug. 18, 2009

(54) INITIALIZATION SEED TO ALLOW DATA PADDING FOR CYCLIC REDUNDANCY CODE CALCULATION

(75) Inventors: Krishnamurthy B. Venkataramana, Folsom, CA (US); Nicholas P. Sadowy, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 1000 days.

(21) Appl. No.: 10/956,233

(22) Filed: Sep. 30, 2004

(65) Prior Publication Data

US 2006/0067365 A1    Mar. 30, 2006

(51) Int. Cl.
*H03M 13/00*  (2006.01)
(52) U.S. Cl. .................................... 714/758
(58) Field of Classification Search ............. 714/758
See application file for complete search history.

(56) References Cited

U.S. PATENT DOCUMENTS 6,597,526 B1 *  7/2003  Gray .......................... 360/40
6,609,225 B1 *  8/2003  Ng .............................. 714/781
2003/0159101 A1 *  8/2003  Hyland et al. ............... 714/781

* cited by examiner

*Primary Examiner*—Guy J Lamarre
*Assistant Examiner*—Sam Rizk
(74) *Attorney, Agent, or Firm*—Grossman, Tucker, Perreault & Pfleger, PLLC

(57) ABSTRACT

Embodiments include determining seed codes for various numbers of padding bits to be used to pad least significant bit (LSB) positions of a variable length message. Thus, a transmitter having a uniform length cyclic redundancy code (CRC) calculator may accept variable length messages and pad them with various numbers of padding bits to make padded messages having lengths equal to that of the calculator. Then the calculator may calculate the CRC for the padded message using an appropriate seed code as an initial code, so that the CRC for the padded message is equal to a CRC calculated for the variable length message using a calculator having a length equal to the length of the variable length message. Since the CRC calculated by the uniform length calculator is the correct CRC for the variable length message, it may be used by a receiver to verify that a message received is variable length message.

27 Claims, 6 Drawing Sheets

INITIALIZATION SEED TO ALLOW DATA PADDING FOR CYCLIC REDUNDANCY CODE CALCULATION

BACKGROUND

1. Field

Data communication. Specifically, communication of data messages using cyclic redundancy code (CRC) checks.

2. Background

Digital data communication, such as communication of data messages over a peripheral component interconnect (PCI), a PCI extended (PCI-X), a PCI (PCI-E), or another synchronous or asynchronous communication links may send error checking information to ensure that data messages received by a data message receiver are not altered. For example, data messages may be transmitted over a PCI bus using transaction layer packets (TLP) having cyclic redundancy codes (CRC) appended to each data message. Each CRC transmitted is calculated by a CRC calculator at the transmitter using the data message, appended at the most significant bit (MSB) and of the data message and transmitted with the data message to the receiver. The receiver calculates a receiver CRC using the data message received. The receiver compares the receiver CRC calculated with the CRC received from the transmitter. If the two CRCs match, then the data message received is presumed valid, or error free.

A CRC is a function of the (1) data message to be transmitted, (2) a standard polynomial, and (3) an initial CRC value or code. Appropriate standard polynomial and CRC values are defined in specifications such as the 3GIO base specification (see the PCI Express Base Specification, revision 1.0a and Published Apr. 15, 2003 by PCI-Special Interest Group (SIG) Administration, Portland Oreg.). To calculate a CRC in one clock cycle, a CRC calculator having a processing capability to process a length of data bits in one clock cycle equal to the length of the data message may be used. Thus, for variable length messages, a transmitter may include a CRC calculator for each length message to be transmitted.

BRIEF DESCRIPTION OF THE DRAWINGS

Various features, aspects and advantages will become more thoroughly apparent from the following detailed description, the set of claims, and accompanying drawings in which:

DETAILED DESCRIPTION

Figure 1:
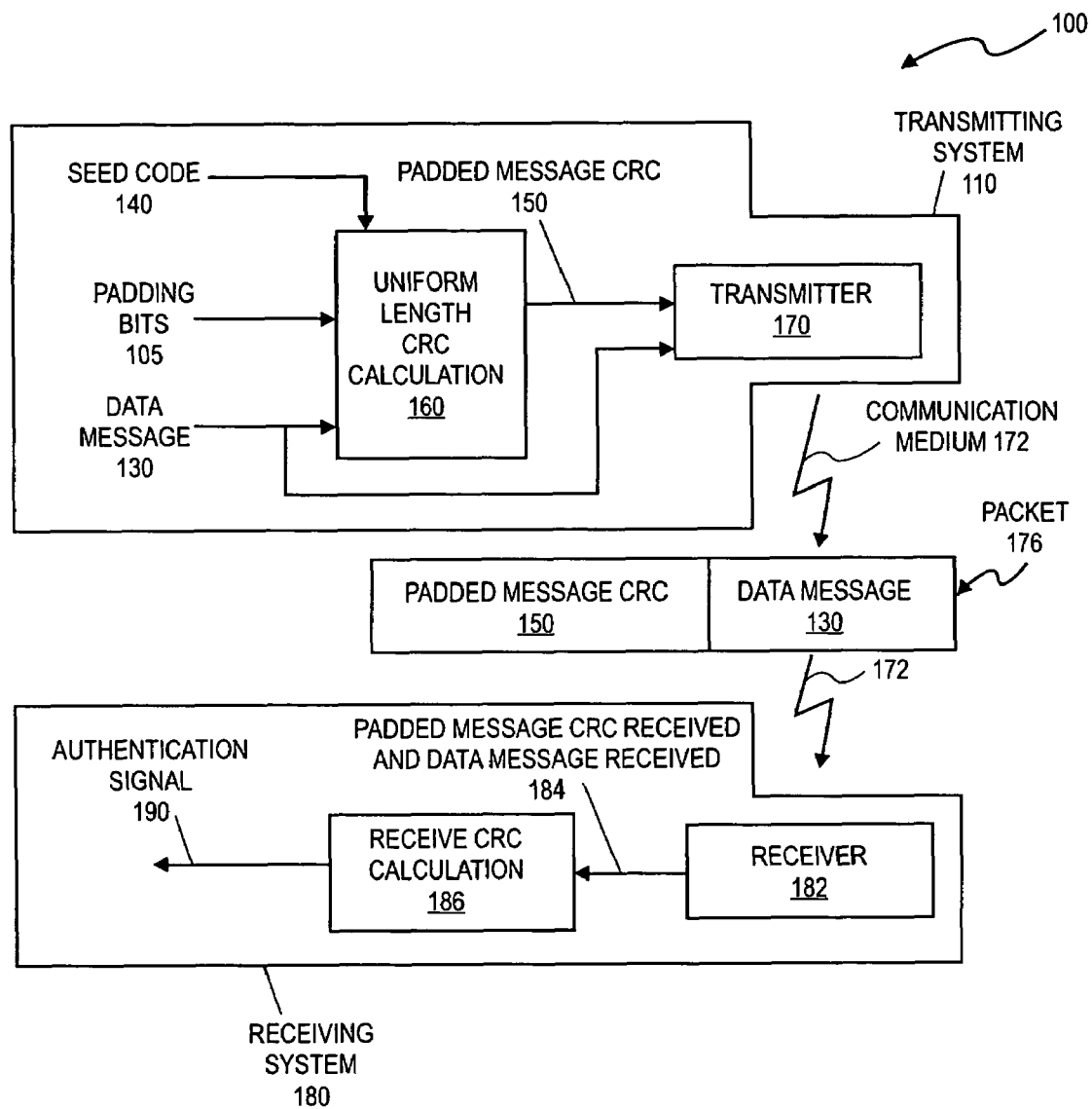
FIG. 1 is a block diagram of an environment to allow transmitter data padding for cyclic redundancy code (CRC) calculations.

FIG. 1 is a block diagram of an environment to allow transmitter data padding for cyclic redundancy code (CRC) calculations. FIG. 1 shows environment 100 including transmitting system 110 transmitting packet 176 over communication medium 172 to receiving system 180. Transmitting system 110 includes uniform length CRC calculator 160 receiving seed code 140, padding bits 105. Transmitting system 110 also includes transmitter 170 receiving padded message CRC 150 from calculator 160, and data message 130.

FIG. 1 also shows packet 176 including padded message CRC 150 and data message 130. Padded message CRC 150 may be appended to, concatenated with, assembled with, or linked to the most significant bit (MSB) position or end of data message 130.

Receiving system 180 includes receiver 182 to receive packet 176 and to send padded message CRC received and data message received 184 to receiver CRC calculator 186. Receiver CRC calculator 186 outputs authentication signal 190.

Environment 110 may be an environment within one or more computing systems, such as an environment including a communication medium that may be within one computing system or between various computing systems (e.g., such as over a network, wired link, or wireless link). For example, environment 100 may be within a computing system such as personal computer (PC), desktop computer, laptop computer, client computer, server computer, personal digital assistant (PDA), cellular telephone, or any other digital processor or processing system which transmits data messages from a transmitter to a receiver. In some embodiments, transmitting system 110, communication medium 172, and/or receiving system 180 may be embodied in software instructions or in a machine accessible medium containing such instructions. Likewise, transmitting system 110, communication medium 172, and/or receiving system 180 may be part of a computing system having a processor (e.g., such as processor 240 as described below for FIG. 2) and a memory (e.g., such as memory 242 as described below for FIG. 2) to store instructions, such as those described above, to be executed by the processor.

Moreover, according to embodiments, transmitting system 110 and/or receiving system 180 may be a computing system (e.g., such as described above for environment 100), a digital communication chip, a digital signal processor, or another device for communicating over a peripheral component interconnect (PCI) bus, PCI-Express (PCI-E) link, medium 172, or other communication medium over which data messages and cyclic redundancy code (CRC) are transmitted to perform CRC code checks on the data messages transmitted.

Communication medium 172 may be a medium for communicating within environment 100, such as a computer bus (e.g., such as a bus on a motherboard or interfacing various components of a computer), a PCI bus, a PCI-E link, a wired communication medium, a wireless communication medium, a network (e.g., such as a local area network, intranet, or the Internet), or various other communication mediums where CRCs are used to validate data messages transmitted.

According to embodiments, calculator 160 accepts data message 130, such as a variable length message having various numbers of data bits within the data message. Thus, data message 130 may have more or fewer bits than the bit processing capability of calculator 160 within one clock cycle. Thus, if data message 130 is shorter in length than the processing capability, length, or number of bits (e.g., the number of bits capable of being processed within one clock cycle) of calculator 160, the least significant bit (LSB) position or end of data message 130 or a portion thereof (e.g., a "message portion") may be padded with one or more bits to form a padded message having a length equal to that of calculator 160. Padding the LSB position of data message 130 may be described as assembling, appending, adding to, and concatenating, or linking one or more padding bits to the LSB position or end of the data message or portion thereof. For example, if data message has more bits in length than the processing capability of calculator 160, data message 130 may be separated into two or more portions for processing by calculator 160. In this manner, calculator 160 may calculate a CRC for data message 130, or a portion thereof, within one clock cycle. To provide a proper CRC for the padded message, calculator 160 uses seed code 140 as an initial CRC code, from which to initiate calculating the CRC for the padded message. For example, seed code 140 may be a seed code determined based on the length of data message 130, or the portion thereof used to form the padded message and the length of calculator 160. Thus, calculator 160 may perform a CRC calculation on the padded message (e.g., the message including data message 130 or a portion thereof and padding bits 105) using seed code 140 as an initial code to provide padded message CRC 150 to transmitter 170.

It can be appreciated that where the length of data message 130 is greater than the length of calculator 160, padded message CRC 150 may be a CRC calculated by calculating a CRC for a portion of data message 130 padded with padding bits 105 as described above, and using that CRC as an initial code to calculate the CRC for the remainder of data message 130.

According to embodiments, seed code 140 is determined so that padded message CRC 150 is equal to a CRC calculated for data message 130 using a CRC calculator having a length equal to the length of data message 130 and using an initial code of all asserted bits. Thus, transmitter 170 may receive data message 130 and padded message CRC 150, where padded message CRC 150 is the appropriate CRC for data message 130 even though the length of calculator 160 is not equal to the length of data message 130. Transmitter 170 can then transmit packet 176 on communication medium 172 to receiving system 180.

Receiving system 180 receives packet 176 from communication medium 172. However, it should be appreciated that the packet received by receiving system 180 may or may not contain the exact same data (e.g., such as the exact same values in the exact same bit patterns asserted and unasserted data bits) as those transmitted by transmitter 170. For instance, some of the bits of the packet 176 may change during travel through medium 172 due to shortcomings in the ability of medium 172 to provide to receiving system 180, exactly what was sent by transmitting system 110. Thus, receiver 182 receives packet 176 and sends padded message CRC received and data message received 184 to receiver CRC calculator 186 to determine whether or not the data received from communication medium 172 is the data sent by transmitter 170. For example, receiver CRC calculator 186 calculates a receiver CRC for the data message received and determines whether that CRC is equal to the padded message CRC received from the transmitter 170. If the two CRCs match, then calculator 186 sends a valid, data good, data authentic, or other signal via authentication signal 190 indicating that the data received (e.g., such as message 130) is error free. Conversely, if the CRC calculated by calculator 186 does not match the padded message CRC received, calculator 186 sends a invalid or error message via authentication signal 190 to indicate that the data is not a match with the data sent by transmitter 170.

In accordance with embodiments, a code, a message, and/or a bit as described herein may include or be represented by asserted bits, set bits, unasserted bits, and/or reset bits. For example, asserted or set bit may be a "high" bit or signal (e.g., such as a logical "1"), a "low" bit or signal (e.g., such as a logical "0"), or another bit or asserted-type of signal (e.g., such as an analog signal, or logical tri-state environment signal) that can be interpreted by electronic circuitry such as control logic, logic gates, indexes, buffers, shifters, processors, multiplexors, and/or registers to distinguish that bit or signal as compared to other bits or signals received by that circuitry. Correspondingly, and unasserted or reset bit may be a bit or signal as described above for an asserted bit, such as by being the inverse thereof.

Figure 2:
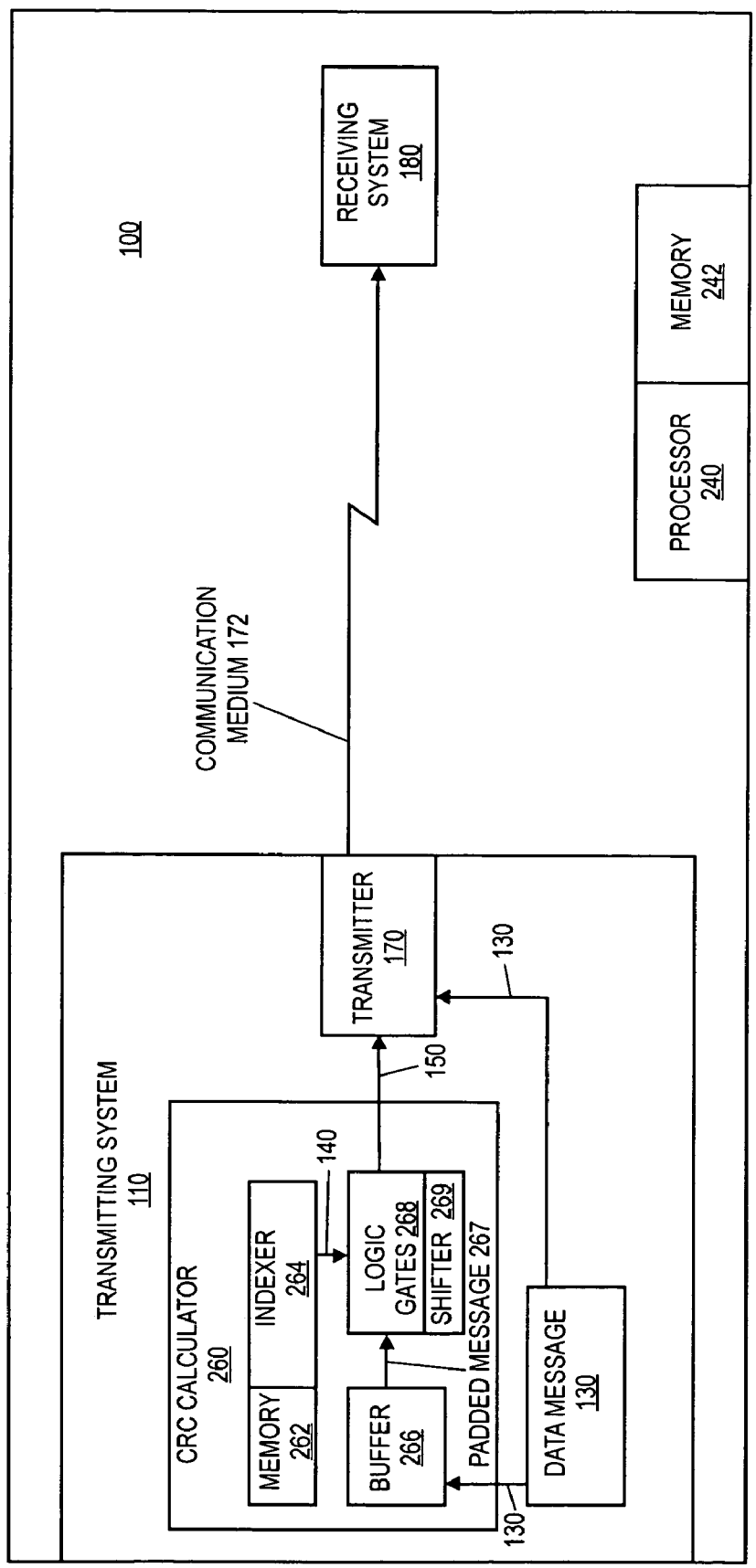
FIG. 2 is a block diagram of a system to allow transmitter data padding for CRC calculations.

FIG. 2 is a block diagram of a system to allow transmitter data padding for CRC calculations. FIG. 2 shows environment 100, including transmitting system 110 to transmit data over communication medium 172 to receiving system 180 such as described above in FIG. 1. FIG. 2 also shows environment 100, such as a computing system, including processor 240 and memory 242 to store an application to be executed by processor 240. Processor 240 and memory 242 may be a processor and memory as described for environment 100 of FIG. 1.

Transmitting system 110 includes CRC calculator 260 having memory 262, indexer 264, buffer 266, and logic gates 268. Indexer at 264 is for indexing data from memory 262, such as to retrieve seed codes from a list, table, or index of seed codes stored in memory 262. Indexer 264 then provides the seed codes, or access thereto, to logic gate 268 via seed codes 140.

FIG. 2 also shows data message 130 provided to buffer 266 and transmitter 170. Calculator 260 may be hardware or software as described above for environment 100 and/or for transmitting system 110. Buffer 266 may be a buffer, register, accumulator, memory, or other hardware or software to pad a least significant bit position or end of message 130 with a number of padding bits, such as by concatenating a number of unasserted bits to the message 130. The message padded with the padding bits, or padded message 267, is transmitted or accessible to logic gates 268 from buffer 266. Thus, calculator 260 may pad variable length messages received as message 130 by adding padding bits at buffer 266 and send padded message 267 to logic gates 268, where padded message 267 has a number of bits or length equal to the number of bits or length capable of being processed by logic gates 268 in one clock cycle.

Memory 262 may be a memory to store a number of seed codes (e.g., such as seed code 140), where each seed code corresponds to a number of bits (e.g., such as a number of padding bits) where a CRC calculated for the number of bits using the seed code as an initial code results in a CRC of all asserted bits. Memory 262 may be a random assess memory (RAM), flash memory, read only memory (ROM) or other memory. Also, indexer 264 may select or identify an appropriate seed code from the seed codes for a message, such as a variable length message. The appropriate seed code (e.g., such as seed code 140) may be the seed code corresponding to a number of bits equal to the number of padding bits of padded message 267.

Logic gates 268 may be embodied in hardware or software. For example, logic gates 268 may be a number of AND, OR, NOT, NAND, NOR, XOR, and/or XNOR logic gates. Specifically, logic gates 268 may be XOR, or XNOR gates to produce a CRC for padded message 267 using the seed selected by indexer 264 (e.g., such as seed code 140). Similarly, as described above with respect to calculator 160, calculator 260 may having a processing capability within one clock cycle to process a number of bits that is greater than the number of bits of data message 130 or a portion thereof.

Calculator 260 also includes shifter 269, such as hardware or software to shift and reverse intermediate CRC calculated by logic gates 268 towards a most significant bit position of the reverse intermediate CRC to remove the most significant bit of the reverse intermediate CRC and add a most significant bit of message 267 to the least significant bit position of the reverse intermediate CRC. An immediate CRC may be defined as a CRC calculated prior to consumption of all the bits of a message by a CRC calculator or a CRC calculation process (e.g., see process 300 of FIG. 3). Specifically, shifter 269 may be a shift register to shift bits of message 267 for calculating a CRC of message 267 using seed code 140 and logic gates 268.

Transmitter 170 may include hardware, software, registers, buffers, shifters, accumulators, and/or memory to append, concatenate, or assemble padded message CRC 150 to the most significant bit position or end of data message 130. Transmitter may also include "logic" such as code, software, programming, hardware, buffers, circuitry, logic gates, or other logical processing capability to transmit CRC 150 appended to message 130. It is also considered that transmitter 170 may include logic to append or concatenate numerous CRC 150/message 130 pairs or packets to each other, to form data for transmission via communication medium 172 to receiving system 180. Thus, transmitter 170 may transmit multiple ones or a group of packet 176's having CRC 150's and message 130's, to receiving system 180 via medium 172, such as is described above with respect to FIG. 1.

Figure 3:
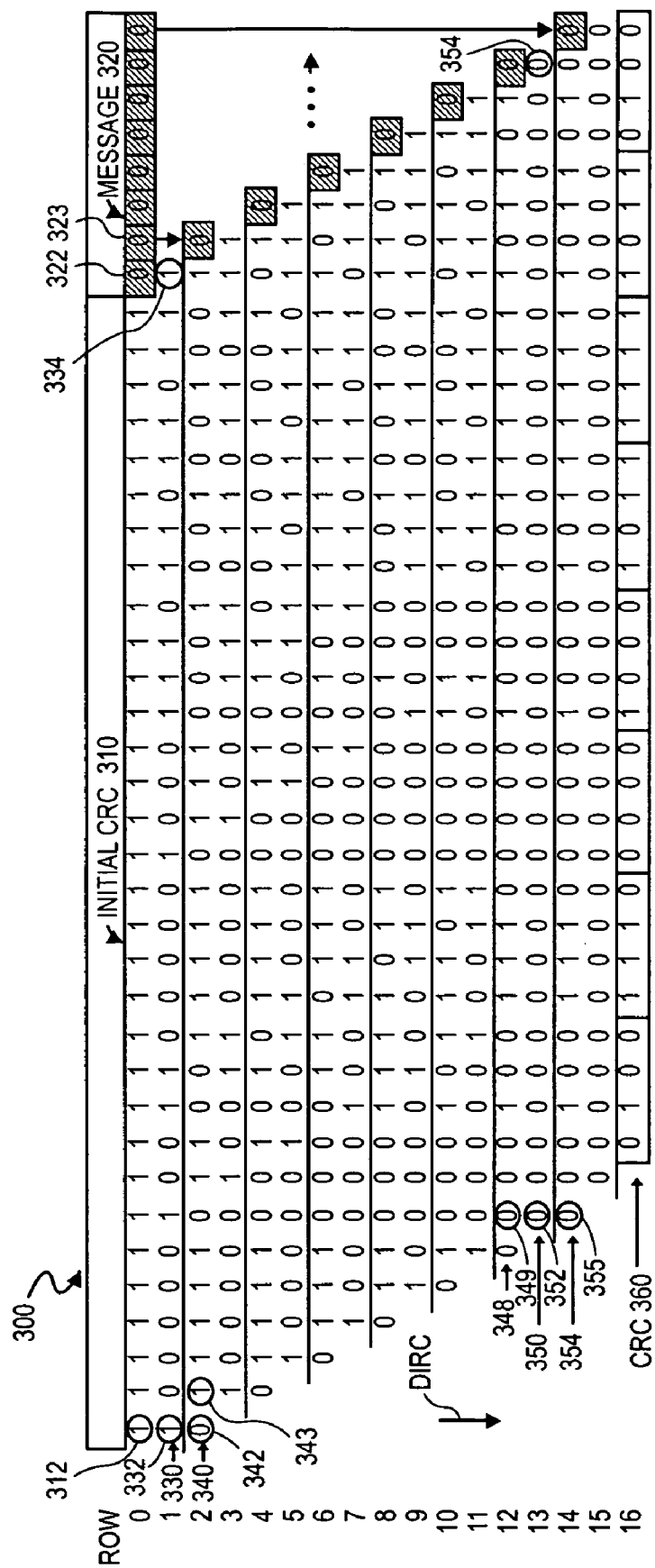
FIG. 3 shows bit patterns for performing a CRC calculation.

FIG. 3 shows bit patterns for performing a CRC calculation. FIG. 3 shows CRC calculating process 300 including initial CRC 310, message 320, Row 0 through 16, and CRC 360. Specifically, initial CRC 310 is shown as all asserted bits and message 320 is shown as all unasserted bits. CRC polynomial 330 has an asserted bit (e.g., a "1") at the LSB position (e.g., at bit 334). Polynomial 330 also has an asserted bit at the MSB position (e.g., at bit 332) of the polynomial for all CRC calculations making it "0x104c11db7". Polynomial 330 may be described as a polynomial argument for calculating CRC 360. Alternatively, FIG. 3 shows all bits unasserted argument 350 having all bits unasserted (e.g., each bit is a "0"). Thus, argument 350 has an unasserted most significant bit, bit 352, and an unasserted least significant bit, bit 354.

For example, in FIG. 3, CRC 310 may be defined as an initial code for calculating CRC 360. To calculate the CRC of message 320, the most significant bit of message 320, bit 322, is shifted to or appended at the least significant bit position of CRC 310. Now, since the most significant bit, bit 312, of CRC 310 is an asserted bit (e.g., such as by the MSB of CRC 310 being a "1"), CRC polynomial 330 is used as the argument at Row 1 for calculating reverse intermediate CRC 340. Alternatively, if bit 312 were an unasserted bit (e.g., such as if the MSB of CRC 310 was a "0"), then argument 350 would be used at Row 1 instead of polynomial 330.

A XOR computer logic calculation is performed on the vertically corresponding bits of CRC 310 and polynomial 330, the result of which is reverse intermediate CRC 340. The following tables show XOR and XNOR computer logic outputs versus inputs.

TABLE 1

| Input 1 | Input 2 | XOR Output |
|---------|---------|------------|
| 0 | 0 | 0 |
| 0 | 1 | 1 |
| 1 | 0 | 1 |
| 1 | 1 | 0 |

TABLE 2

| Input 1 | Input 2 | XNOR Output |
|---------|---------|-------------|
| 0 | 0 | 1 |
| 0 | 1 | 0 |
| 1 | 0 | 0 |
| 1 | 1 | 1 |

As shown, according to XOR logic, and input of an asserted bit and an unasserted bit leads to an output of an asserted bit, and input of an unasserted bit and an asserted bit leads to an output of an asserted bit, an input of an unasserted bit and an unasserted bit leads to an output of an unasserted bit, and an input of an asserted bit and an asserted bit leads to an output of an unasserted bit. The outputs of the XNOR computer logic are just the inverse of those described above for the XOR logic.

By definition, MSB 342 of reverse intermediate CRC 340 is an unasserted bit (e.g., such as a "0"), since if bit 312 is asserted, polynomial 330 having bit 332 asserted is chosen, and alternatively, if bit 312 were unasserted, all bits unasserted argument 350 having bit 352 unasserted would be chosen for the argument to perform the XOR with CRC 310. After CRC 360 is calculated, the MSB, bit 342, is dropped (always in unasserted bit). This process may be described as shifting CRC 340 towards its MSB end. Then the next bit, bit 323 of message 320 is appended at the end of CTC 340. Afterwards, the process of determining whether to use polynomial 330 or argument 350 as the argument to XOR with CRC 340 with bit 323 by inspecting bit 343 is repeated. CRC 340 with bit 323 is then XORedoute with the proper argument and the process is repeated.

For example, process 300 progresses in direction DIRC to Row 12. At Row 12, sixth reverse intermediate CRC 348 is shifted towards its MSB position to have MSB bit 349. Since MSB bit 349 is unasserted, the argument chosen is all bits unasserted argument 350. When an XOR is performed on corresponding bits of CRC 348 and argument 350, the result is 7 reverse intermediate CRC 354. Iterations of this process are continued until all of the bits of message 320 are consumed. The resulting CRC, CRC 360, is the CRC for message 320. From FIG. 3 it can be seen that process 300 is a bit-wise serial calculation. For example, if message 320 included more bits, the process could continue repeating, as described above, until all of the bits of message 320 were consumed.

Certain observations of process 300 can be made to understand how reverse calculate CRC 360 to CRC 310, such as to reverse calculate a CRC of all asserted bits at CRC 360 to determine a CRC at CRC 310 that is a seed code corresponding to padding bits of message 320 (e.g., eight unasserted padding bits). For instance, first it can be observed that forward or backward iterations of process 300 may be continued for any length message. Second, message 320 (e.g., or padding bits represented by bits of message 320) are all unasserted. Third, arguments for determining an reverse intermediate CRC may be either polynomial 330 having an asserted LSB or argument 350 having an unasserted LSB.

More particularly, if an appropriate initial CRC (e.g., a "seed code") were chosen for CRC calculation process 300, (e.g., a CRC other than all asserted bits CRC 310) and a message were padded with 8 unasserted bits (e.g., message 320) then it would be possible to have an reverse intermediate CRC of all asserted bits at the point when the 8 unasserted padding bits were consumed in the CRC calculation, and the bits of the message were about to be consumed (e.g., instead of CRC 360). Such an appropriate seed code could be used as an initial code (e.g., an initial CRC) by a uniform length CRC calculator having a length equal to the variable length message appended with the 8 unasserted bits to calculate a "final" CRC of a variable length message appended with 8 unasserted bits (e.g., a "padded message", padded with 8 unasserted bits at its LSB end).

The uniform length CRC calculator would initiate CRC calculation on the padded message using the seed code. The reverse intermediate CRC when all of the padding bits were consumed by the CRC calculation would be all asserted bits. The reverse intermediate CRC would then be the de-facto initial CRC for the variable length message (e.g., without the padding bits). The final CRC of the calculation would then be a CRC equal to a CRC for the variable length message (e.g., without the padding unasserted bits), calculated using a CRC calculator having a length equal to the variable length message using an initial code of all asserted bits.

Thus, if a proper seed code can be determined that results in a CRC calculation for the 8 unasserted bits (e.g., message 320) of all asserted bits, then that seed code can be used as an initial calculation for a padded message, padded with the 8 unasserted bits, such that the CRC calculator for the padded message is the correct or accurate CRC (e.g., such as according to a given specification, like the 3GIO Specification described above) for the variable length message without the padding bits. Moreover, since the CRC calculation is a bitwise serial calculation, such a seed code can be calculated for various numbers of padding bits, such as one padding bit, two padding bits, three padding bits, . . . through hundreds or thousands of padding.

Figure 4:
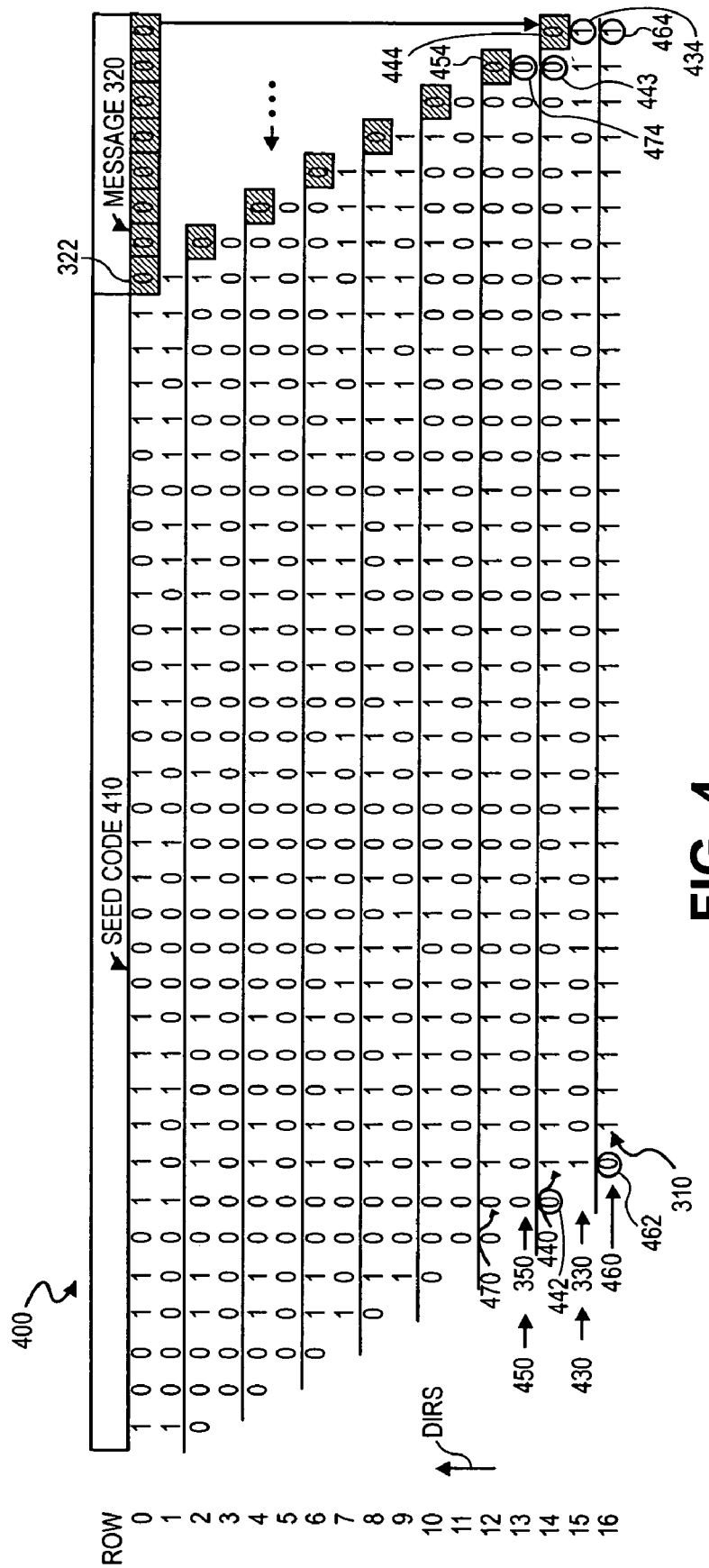
FIG. 4 shows bit patters for determining a seed code.

For example, FIG. 4 shows bit patterns for determining a seed code. FIG. 4 shows seed code determination of process 400 including seed code 410, message 320, Row 0 through 16, and intermediate CRC 460. Seed code 410 is a seed code reverse calculated from CRC 310 using the result of observations described with respect to process 300 and process 400 to identify arguments for performing the reverse calculation. FIG. 4 shows argument 430 at Row 15 and argument 450 at Row 13. For example, according to embodiments, according to embodiments, it is possible to use process 400 to calculate backwards, or determine seed code 410 from intermediate CRC 460, where intermediate CRC 460 is initial CRC 310, appended with an unasserted bit 462 at its MSB position. Thus, determining seed code 410 may be performed by process 400 moving in direction DIRS from intermediate CRC 460, by calculating reverse CRCs backwards using certain observations. A reverse immediate CRC may be defined as a CRC calculated prior to consumption of all the bits of a message by a reverse CRC calculator or calculation process.

A first helpful observation is that the value of the LSB of CRC 460, bit 464 is asserted (e.g., as all bits of CRC 310 are asserted). Next, the result of the XOR logic performed on bit 444 (e.g., the LSB of message 320) and bit 434, (e.g., the LSB of argument 430) results in bit 464. Also, argument 430 is either polynomial 330 (having an asserted LSB) or all unasserted bits argument 350 (having an unasserted LSB). Therefore, since bit 464 is asserted and bit 444 is unasserted, according to the XOR logic to calculate bit 464, bit 434 must be asserted. Furthermore, since bit 434 is asserted, argument 430, must be polynomial 330.

Alternatively, it can be appreciated, that if bit 464 were unasserted, and bit 444 is unasserted, that bit 434 must be unasserted, according to the XOR logic. Note that for message 320 having unasserted bit, the bit at position 444 will always be unasserted. According to embodiments, asserted and/or unasserted bits may be used in message 320, such as where bits of message 320 are used as padding bits 105. In this situation, argument 430 may still be predicted according to XOR logic, or XNOR logic, as long as it is known whether bit 444 is an asserted, or an unasserted bit.

Once it is determined whether argument 430 is to be polynomial 330 or all unasserted bits argument 350, it can be determined what the value of the bits of seventh reverse intermediate CRC 440 will be. For example, each corresponding bit to CRC 460 and polynomial 330 can be used to perform a reverse XOR logic calculation to determine what the bit of CRC 440 as an input would be. Similarly, since the XOR logic is reversible, the bits of intermediate CRC 460 and polynomial 330 may be used as inputs to XOR logic to determine the bits of CRC 440 as an output. Thus, the bits of CRC 440 are calculated, and the process may repeat using CRC 440 as a reverse intermediate CRC, as described above for CRC 460 to determine sixth reverse intermediate CRC 470.

Specifically, seventh reverse intermediate CRC 440 may be shifted towards the least significant bit position by one bit so that bit 444 is removed and an unasserted bit, such as bit 442 may be added to the MSB position of CRC 440, such as shown in Row 14 of FIG. 4. Here, by observing that bit 443, the LSB+1 bit of CRC 440 is unasserted, that bit 454 of six reverse intermediate CRC 450 is unasserted (e.g., since bit 454 is from message 320 of all unasserted bits) and that the logic for producing bit 434 is XOR logic, it can be deduced that bit 474 must be unasserted. Therefore, argument 450 must be all unasserted bits argument 350. Process 400 may be continued in direction DIRS until all of the bits of message 320 (e.g., such as padding bits 105) are consumed. At that point, when the reverse calculation for bit 322 of message 320 is performed, the bits to the left of bit 322 will be seed code 410. Thus, seed code 410 is an example of a seed code for padding a message with 8 unasserted bits (e.g., message 320). As such a CRC calculated or a padded message having a LSB position padded by 8 "0"'s (e.g., message 320), using seed code 410 as an initial code, and using a CRC calculator having a length equal to the length of the padded message will be equal to a CRC calculated for the variable length message using all asserted bits as an initial code and using a CRC calculator having a length equal to the length of the variable length message. It can be appreciated that by calculating seed codes using processes similar to process 400 for various numbers of padding bits (e.g., such as for messages similar to message 320 having more or fewer unasserted bits), seed codes can be generated for padding various length messages with various numbers of unasserted bits. Moreover, the various seed codes for the various numbers of padding bits can be stored, such as in memory 262, as shown in FIG. 2. Then, the stored various seed codes may be indexed to identify an appropriate seed code for a uniform length CRC calculator. Specifically, various seed code for various numbers of padding bits stored in memory 262 may be indexed by indexer 264 according to the length or number of bits that may be processed in one clock cycle by calculator 260 (e.g., such as by logic gates 268 and shifter 269).

Where using seed code 410 to initiate a CRC calculation of a variable length message padded with 8 "0" bits (e.g., message 320), initial CRC 310, as shown in FIG. 4, may be described as an reverse intermediate CRC calculated when calculating a CRC for the padded message exhausts all of the padding bits of message 320. Thus, at the point that CRC 310 (e.g., the reverse intermediate CRC) is calculated, CRC 310 will become the initial CRC for calculating the CRC for the bits of the variable length message (e.g., the data of message 130 without padding bits 105). Moreover, it can be appreciated that when forward calculating the bits of process 400 (e.g., such as in a direction opposite that of direction DIRS), CRCs calculated starting with seed code 410 as an initial code and progressing towards intermediate CRC 460, may be described as intermediate CRCs for calculating intermediate CRC 460.

Although in FIGS. 3 and 4, message 320 is all unasserted bits, it can be appreciated that process 300 and process 400 may be performed for asserted and/or unasserted bits in message 320. For example, process 400 may be performed as long as the value of the bits of message 320 are known beforehand. Specifically, where message 320 includes padding bits (e.g., such as padding bits 105) to pad a variable length message, as long as the value of the bits used as padding bits 105 is known, it is possible to use process 400 to determine a proper seed code for the padding bits.

Also, according to embodiments, although in FIGS. 3 and 4, XOR logic is used, it is also considered that XNOR logic may be used instead. For example, XNOR logic provides inverted or opposite values as compared to XOR logic. Thus, the concepts described above can also be applied with XNOR logic, although the resulting seed code and final CRC may differ, the final CRC code may still be used by a receiver having a CRC calculator also using XNOR logic to compare the CRC for the padded message with the CRC calculated at the receiver.

Figure 5:
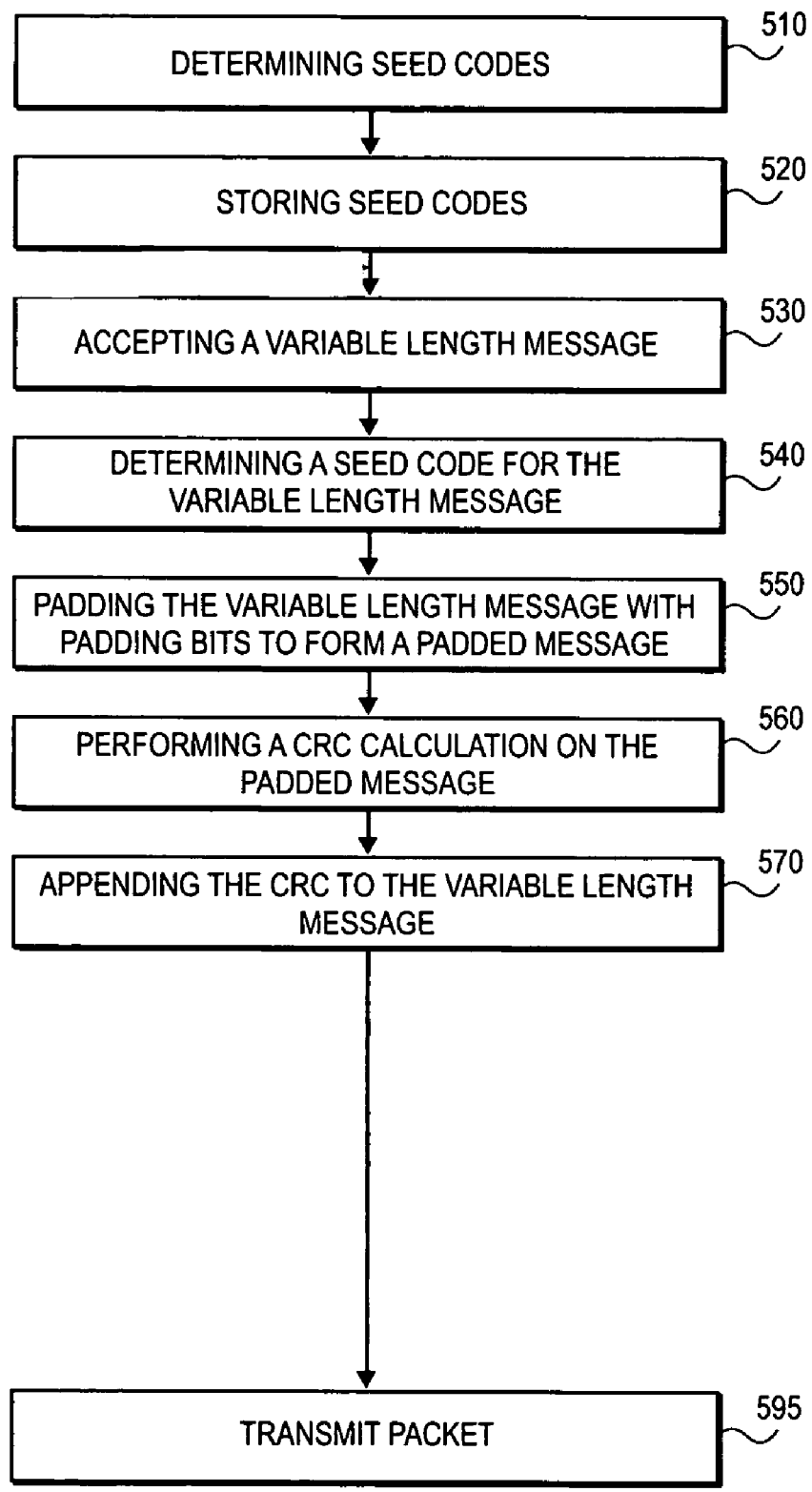
FIG. 5 is a flow diagram showing a process to allow transmitter data padding for CRC calculations.

For example, FIG. 5 is a flow diagram showing a process to allow data padding for CRC calculations. At block 510 seed codes are determined. Block 510 may correspond to determining seed codes, such as process 400 for determining seed code 410, as described above with respect to FIG. 4, and seed code 140 as described above with respect to FIGS. 1 and 2. Thus, the seed codes determined at block 510 may be for or correspond to one or more different numbers of padding bits. At block 520 the seed codes are stored. Block 520 may correspond to storing seed codes in a memory, such as is described above with respect to memory 262 of FIG. 2.

Next, at block 530 a variable length message is accepted. Block 530 may correspond to accepting data messages having various number of bits, or length, such as is described above with respect to data message 130 of FIGS. 1 and 2.

At block 540 a seed code for the variable length message is determined. Block 540 may correspond to selecting, indexing, or determining a seed code based on a length or number of bits of the variable length message (e.g., such as message 130) and the length or number of bits of a uniform length CRC calculator (such as calculator 160 and/or calculator 260). Specifically, block 540 may include looking up or indexing a seed code (e.g., such as using indexer 264) in a table storing a number of seed codes for different lengths or numbers of padding bits (e.g., such as seed codes stored in memory 262), and identifying appropriate seed code which is the seed code corresponding to or for the number of padding bits to be used to pad the variable length message (e.g., such as message 130). Specifically, block 540 may correspond to selecting seed code 140 as described above with respect to FIGS. 1 and 2.

At block 550 the variable length message is padded with padding bits to form a padded message. For instance, block 550 may correspond to padding a variable length message (e.g., such as message 130) with a sufficient number of padding bits (e.g., such as padding bits 105) to form a padded message (e.g., such as padded message 267) having a length equal to the length of a uniform length CRC calculator (e.g., calculator 160, calculator 260, and/or logic gates 268). Thus, the LSB position or end of the variable length message may be padded with the padding bits.

At block 560 a CRC calculation is performed on the padded message. For example, block 560 may correspond to performing a CRC calculation as described above with respect to FIG. 3 on padded message 267 such as described above with respect to FIG. 2. Thus, the padded message CRC may be a CRC calculated for the variable length message by a CRC calculator having a length equal to the padded message and using the seed code determined at block 510 as an initial code. Notably, this padded message CRC, such as CRC 150 as described above with respect to FIGS. 1 and 2, may be a CRC similar to that which would be calculated for the variable length message by a calculator having a length equal to that of the variable length message using an initial code and standard polynomial in accordance with a specification, such as the 3GIO specification mentioned above.

Moreover, as described above with respect to data message 130 and FIG. 1, block 560 may include calculating a CRC for a portion of data message 130, where data message 130 has a length greater than or more bits than the length or processing capability of calculator 160, calculator 260, and/or logic gates 268 are able to process in one clock cycle. Hence, block 560 may include performing a CRC calculation on a portion of data message 130 and using that CRC result as an initial code to calculate a CRC for a second part of data message 130. It can be appreciated that data message 130 may be many times the length of calculator 160, such that the calculations described above can be repeated multiple times before calculating the final total CRC for message 130.

Next, at block 570 the CRC for the padded message is appended to the variable length message. Block 570 may correspond descriptions above with respect to transmitter 170 and packet 176 of FIGS. 1 and 2. Specifically, the least significant bit position of CRC 150 may be appended to the most significant bit position of message 130 to form a CRC/message pair or data packet.

At block 595 the CRC/message pair (e.g., data packet) is transmitted. Block 595 may correspond to transmitting a packet such as is described above with respect to transmitter 170 as described in FIGS. 1 and 2, packet 176 as described above with respect to FIGS. 1 and 2, and data 776 as described below with respect to FIG. 7.

According to embodiments, after block 570 or 595 it may be determined whether the variable length message is the last message to be transmitted on a bus (e.g., such as communication medium 172, or a bus having a bus length as described below for FIG. 7). For example, the process of FIG. 5 through block 570 can be repeated for multiple variable length messages, so that multiple CRC/message packets can be concatenated into a single transmission to be transmitted together on a single bus. Thus, CRC/variable length data packets, such as is described above with respect to transmitter 170 and packet 176 of FIGS. 1 and 2, may be concatenated for transmission on a data bus. Alternatively, the process of FIG. 5 through block 595 can be repeated for multiple variable length messages, so that multiple CRC/message packets are generated to be transmitted separately on one or more buses.

Figure 6:
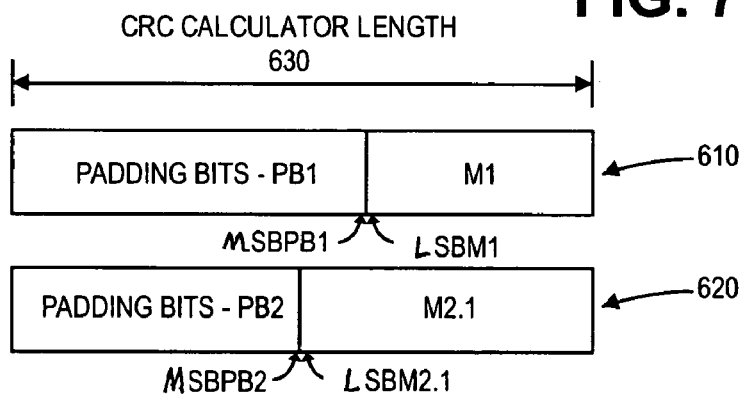
FIG. 6 show two various length messages padded with padding bits.

For example, FIG. 6 shows two variable length messages padded with padding bits. FIG. 6 shows padded message 610 having variable length message M1 and padding bits PB1. Specifically, the least significant bit position of message M1, LSBM1 is appended with the most significant bit position of PB1, MSBPB1. Padding bits PB1 include a sufficient number of bits to cause padded message 610 to have a length equal to CRC calculator length 630. Thus, padded message 610 may correspond to the padded message described with respect to block 550 of FIG. 5.

Similarly, padded message 620 includes message portion M2.1 appended with padding bits PB2. As shown in FIG. 6, message portion M2.1 is a portion of a variable length message having a length greater than CRC calculator length 630. It is to be appreciated that CRC calculator length 630 may be a length that calculator 160, calculator 260, and/or logic gates 268 are able to process in one clock cycle. Thus, message portion M2.1 may be a portion of data message 130, as described above with respect to FIGS. 1 and 2, where data message 130 has a length greater than the length of calculator 160, calculator 260, and/or logic gates 268. FIG. 6 shows the least significant bit of message portion M2.1, LSBM2.1 appended to the most significant bit position of bits BP2, MSBPB2. Padded message 620 may correspond to the description above of block 550 of FIG. 5, for a second message to be padded. Specifically, for example, it may be determined that message M1 is not the last message to be transmitted on a bus, and thus a second message having message portion M2.1 is accepted at block 530, a seed code for message portion M2.1 is determined at block 540, and message portion M2.1 is padded at block 550.

Figure 7:
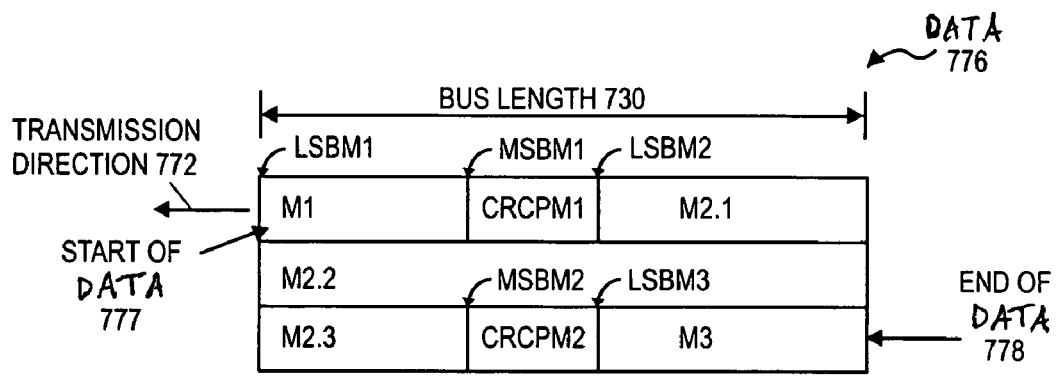
FIG. 7 shows various length messages and CRCs calculated from corresponding padded messages, to be transmitted on a bus.

Furthermore, FIG. 7 shows various length messages and CRCs calculated from corresponding padded messages, to be transmitted on a bus. FIG. 7 shows data 776 for transmission in transmission direction 772 on a bus having bus length 730. Data 776 includes message M1 appended with the CRC for the padded message of M1, CRCPM1. CRCPM1 may be a CRC calculated using a seed code corresponding to a number of padding bits equal to bits PB1, used to calculate the CRC of padded message 610 with a calculator having a uniform CRC calculator length equal to CRC calculator length 630.

Similarly, FIG. 7 shows portions of message M2.1, M2.2, and M2.3, such as portions of a second message having a length greater than bus length 730. Appended to message portion M2.3 is the CRC for padded message 620, message portion M2.2, and message portion M2.3, CRCPM2. For example, CRCPM2 may be calculated by using a seed code corresponding to a number of padding bits equal to bits PB2 to calculate the CRC for padded message 620. The CRC for padded message 620 may then be used as an initial code to calculate a CRC for a message portion M2.2. The resulting calculation of the CRC calculated as described above for message portion M2.2 may then be used as an initial code to calculate the CRC of message portion M2.3. The resulting CRC calculated for potion of message M2.3, described above, may be CRCPM2. Thus, CRCPM2 may be a CRC for a message including message portions M2.1, M2.2, and M2.3, calculated by a calculator and transmitted in data 776.

FIG. 7 also shows message M3 having least significant bit position LSBM3. LSBM3 is appended to CRCPM2. Message portion M2.3 has MSB position MSBM2. CRCPM2 is appended to MSBM2. Similarly, message portion M2.1 has LSB position LSBM2 appended to CRCPM1. CRCPM1 is appended to the most significant bit position of message M1, MSBM1. Data 776 has start of data 777 to be initiated as the first part of data 776 to be transmitted in direction 772. Data 776 also includes end of data 778, as the last part of data 776 to be transmitted in direction 772. Start of data 777 corresponds with the least significant bit message portion M1, LSBM1.

According to embodiments, length 630 may be a length less than, equal to, or greater than length 730. Likewise, length 630 and/or length 730 may be equal to, less than, or greater than a length of any processing components of receiving system 180, such as receiver 182 and/or calculator 186. For example, receiving system 180 may operate independently of length 630, or the length of calculator 160, calculator 260 and/or gates 268. Moreover, system 180 may operate independently of whether or not padding bits are added to the variable length message, because the CRC sent with each variable length message is the same CRC as would be calculated for the variable length message by a calculator having a length equal to the variable length message according to the appropriate specification, such as the 3GIO specification mentioned above. Therefore, it is transparent to the receiver, such as system 180, whether or not the transmitter is a transmitter such as described above with respect to transmitting system 110, or whether the CRC for the message is calculated using padding bits such as described above with respect to FIGS. 1-4.

It is contemplated that the process described above with respect to FIG. 5-7 may be embodied in software instructions, in a machine accessible medium containing such instructions, and/or in a machine implemented process. Likewise, the descriptions above with respect to FIGS. 5-7 may be implemented in an environment, such as environment 100, as described above with respect to FIGS. 1 and 2, and/or in a system, such as a computing system having a processor and a memory to store instructions to be executed by the processor, such as described above with respect to FIG. 2.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising
accepting a variable length message;
determining a seed code for at least one padding bit based on a length of the variable length message and a length of a uniform length cyclic redundancy code (CRC) calculator wherein the determining a seed code for at least one padding bit comprises:
calculating a plurality of first XOR logic outputs for aligned bits of an initial code having an unasserted most significant bit (MSB) and all other bits asserted, and a CRC polynomial, wherein a least significant bit (LSB) of the initial code is aligned with a LSB of the CRC polynomial;
deleting the LSB position of the first XOR logic outputs;
adding an unasserted bit to a MSB+1 position of the first XOR logic outputs; then
calculating a plurality of second XOR logic outputs for aligned bits of the added to first XOR logic outputs, and:
the CRC polynomial, wherein the LSB+1 position of the first XOR logic outputs is aligned with a LSB of the CRC polynomial, if the bit at a LSB+1 position of the first XOR logic outputs is an asserted bit;
a code having all unasserted bits, if the LSB+1 position of the first XOR logic outputs is an unasserted bit;
padding a least significant bit (LSB) end of the variable length message with the at least one padding bit to form a padded message having a length equal to the length of the uniform CRC calculator; and
performing a CRC calculation on the padded message using the uniform CRC calculator and the seed code as an initial code.

2. The method of claim 1, wherein the length of the variable length message is greater than the length of a uniform length cyclic redundancy code (CRC) calculator, and performing a CRC calculation on the padded message includes performing a CRC calculation on a first portion of the padded message using the seed code as an initial code to calculate a first CRC and performing a CRC calculation on a second part of the padded message using the first CRC as an initial code.

3. The method of claim 1, wherein the CRC for the padded message is equal to a CRC calculated for the variable length message using a CRC calculator having a length equal to the length the variable length message and using an initial code of all asserted bits.

4. The method of claim 1, wherein determining the seed code further comprises:
looking up the seed code in a table storing a plurality of seed codes for a plurality of different lengths; and
identifying an appropriate seed code of the plurality, wherein the appropriate seed code is for a length equal to the number of at least one padding bits of the padded message.

5. The method of claim 1, further comprising:
appending a CRC calculated for the padded message to the most significant bit (MSB) end of the variable length message; and
transmitting the variable length message and the appended CRC on a bus.

6. A method comprising:
determining a seed code for at least one padding bit comprising:
calculating a plurality of first XOR logic outputs for aligned bits of an initial code having an unasserted most significant bit (MSB) and all other bits asserted, and a CRC polynomial, wherein a least significant bit (LSB) of the initial code is aligned with a LSB of the CRC polynomial;
deleting the LSB position of the first XOR logic outputs;
adding an unasserted bit to a MSB+1 position of the first XOR logic outputs; then
calculating a plurality of second XOR logic outputs for aligned bits of the added to first XOR logic outputs, and:
the CRC polynomial, wherein the LSB+1 position of the first XOR logic outputs is aligned with a LSB of the CRC polynomial, if the bit at a LSB+1 position of the first XOR logic outputs is an asserted bit;
a code having all unasserted bits, if the LSB+1 position of the first XOR logic outputs is an unasserted bit;
wherein a cyclic redundancy code (CRC) calculated for a padded message having a least significant bit (LSB) position of a plurality of data bits padded with the at least one padding bit, using the seed code as an initial code and using a CRC calculator having a number of bits equal to the number of bits of the padded message, is equal to a CRC calculated for the plurality of data bits using all asserted bits as an initial code and using a CRC calculator having a number of bits equal to the number of bits of the plurality of data bits.

7. The method of claim 6, wherein the at least one padding bit is at least one unasserted bit to add to the LSB end of a data message prior to calculating a CRC for the data message and the at least one unasserted bit to add to the LSB end of a data message.

8. The method of claim 7, wherein determining the seed CRC code for at least one padding bit includes identifying a reverse intermediate CRC of all asserted bits for the plurality of data bits.

9. The method of claim 6, further comprising:
padding the least significant bit (LSB) position of a data message with the at least one padding bit to form a padded message;
calculating a CRC for the padded message using the seed code as an initial code to start calculating the CRC for the padded message.

10. The method of claim 6, further comprising setting the first XOR logic outputs to the second XOR logic outputs and repeating deleting, adding, and calculating a plurality of second XOR logic outputs for a number of iterations equal to the number of at least one padding bits minus two.

11. A method comprising:
padding a least significant bit (LSB) position of a data message with at least one padding bit to form a padded message; and
determining a CRC for the padded message using a seed code as an initial code to start calculating the CRC and a CRC calculator having a number of bits equal to the number of bits of the padded message, wherein determining the CRC for the padded message comprises:
calculating a reverse intermediate CRC of all asserted bits for the at least one padding bit, and
determining a plurality of reverse intermediate CRCs for the padded message after using the seed code as an initial code, wherein the plurality of reverse intermediate CRCs use an argument as an initial code to continue calculating the CRC and the argument is:
a CRC polynomial code having an asserted LSB and an asserted MSB, if the MSB−1 position of an reverse intermediate CRC is asserted, and
a code having all bits unasserted, if the MSB−1 position of a reverse intermediate CRC is unasserted.

12. The method of claim 11, wherein the CRC for the padded message is equal to a CRC calculated for the plurality of data bits using a CRC calculator having a number of bits equal to the number of bits of the plurality of data bits.

13. The method of claim 11, wherein determining the CRC for the padded message further comprises:
looking up the seed code in a table storing a plurality of seed codes for a plurality of different numbers bits; and
identifying an appropriate seed code of the plurality, wherein the appropriate seed code is for a number bits equal to the number of at least one padding bits of the padded message.

14. The method of claim 11, wherein the at least one padding bit is at least one unasserted bit added to the LSB end of the data message.

15. The method of claim 14, wherein the reverse intermediate CRC of all asserted bits is calculated when calculating the CRC for the padded message exhausts the at least one padding bit padding the least significant bit (LSB) position of the data message.

16. The method of claim 11, further comprising:
appending the CRC for the padded message to the most significant bit (MSB) position of the data message; and
transmitting the data message and the appended CRC for the padded message on a bus to a receiver.

17. A system comprising:
a processor;
a memory to store an application to be executed by the processor; and
a CRC calculator including:
a memory to store a plurality of seed codes, wherein each seed code corresponds to a number of bits and calculating a CRC for the bits using the seed code as an initial code results in a CRC of all asserted bits, wherein determining each seed code comprises:
calculating a plurality of first XOR logic outputs for aligned bits of an initial code having an unasserted most significant bit (MSB) and all other bits asserted, and a CRC polynomial, wherein a least significant bit (LSB) of the initial code is aligned with a LSB of the CRC polynomial;
deleting the LSB position of the first XOR logic outputs;
adding an unasserted bit to a MSB+1 position of the first XOR logic outputs; then calculating a plurality of second XOR logic outputs for aligned bits of the added to first XOR logic outputs, and:

the CRC polynomial, wherein the LSB+1 position of the first XOR logic outputs is aligned with a LSB of the CRC polynomial, if the bit at a LSB+1 position of the first XOR logic outputs is an asserted bit;

a code having all unasserted bits, if the LSB+1 position of the first XOR logic outputs is an unasserted bit;

a buffer to pad a LSB position of a data message with a number of padding bits;

an indexer to select an appropriate seed code of the plurality of seed codes for a data message, the appropriate seed code corresponding to a number of bits equal to the number of padding bits padding a LSB position of the data message;

a plurality of logic gates to produce a CRC for a padded message having a LSB position padded with a number of padding bits, wherein the logic gates use the appropriate seed code corresponding to the number of padding bits.

18. The system of claim 17, wherein the calculator comprises a processing capability within one clock cycle to process a number of bits that is greater than the number of bits of the data message.

19. The system of claim 17, wherein the plurality of logic gates include a plurality of XOR logic gates, each comprising:

a first input from the appropriate seed code;

a second input from one of a code having all bits unasserted, and a CRC polynomial having an asserted LSB and an asserted MSB; and an output to output a bit of a first CRC.

20. The system of claim 19, further comprising a shifter to shift the first CRC towards a MSB position of the first CRC and to add a MSB of the message to a LSB position of the first CRC.

21. The system of claim 17, wherein the plurality of logic gates are one of XOR logic gates and NXOR logic gates.

22. A machine accessible medium containing instructions that, when executed, cause a machine to:

determine a seed code for at least one padding bit comprising:

calculating a plurality of first XOR logic outputs for aligned bits of an initial code having an unasserted MSB and all other bits asserted, and a CRC polynomial, wherein a LSB of the initial code is aligned with a LSB of the CRC polynomial;

deleting the LSB position of the first XOR logic outputs;

adding an unasserted bit to a MSB+1 position of the first XOR logic outputs; then calculating a plurality of second XOR logic outputs for aligned bits of the added to first XOR logic outputs, and:

the CRC polynomial, wherein the LSB+1 position of the first XOR logic outputs is aligned with a LSB of the CRC polynomial, if the bit at a LSB+1 position of the first XOR logic outputs is an asserted bit;

a code having all unasserted bits, if the LSB+1 position of the first XOR logic outputs is an unasserted bit, wherein a cyclic redundancy code (CRC) calculated for a padded message having a least significant bit (LSB) position of a plurality of data bits padded with the at least one padding bit, using the seed code as an initial code and using a CRC calculator having a number of bits equal to the number of bits of the padded message, is equal to a CRC calculated for the plurality of data bits using all asserted bits as an initial code and using a CRC calculator having a number of bits equal to the number of bits of the plurality of data bits.

23. The machine accessible medium of claim 22, further comprising instructions to cause a machine to:

set the first XOR logic outputs to the second XOR logic outputs and repeat deleting, adding, and calculating a plurality of second XOR logic outputs for a number of iterations equal to the number of at least one padding bits minus two.

24. The machine accessible medium of claim 22, further comprising instructions to cause a machine to:

determine a plurality of seed codes for a plurality of different numbers of the at least one padding bits; and store the plurality of seed codes in a memory.

25. A machine accessible medium containing instructions that, when executed, cause a machine to:

pad a least significant bit position of a data message with the at least one padding bit to form a padded message;

look up a seed code for the padded message, in a table comprising a plurality of seed codes, wherein determining each seed code comprises:

calculating a plurality of first XOR logic outputs for aligned bits of an initial code having an unasserted most significant bit (MSB) and all other bits asserted, and a CRC polynomial, wherein a least significant bit (LSB) of the initial code is aligned with a LSB of the CRC polynomial;

deleting the LSB position of the first XOR logic outputs;

adding an unasserted bit to a MSB+1 position of the first XOR logic outputs; then calculating a plurality of second XOR logic outputs for aligned bits of the added to first XOR logic outputs, and:

the CRC polynomial, wherein the LSB+1 position of the first XOR logic outputs is aligned with a LSB of the CRC polynomial, if the bit at a LSB+1 position of the first XOR logic outputs is an asserted bit;

a code having all unasserted bits, if the LSB+1 position of the first XOR logic outputs is an unasserted bit;

wherein a CRC for the padded message using the seed code as an initial code, and using a CRC calculator having a number of bits equal to the number of bits of the padded message is equal to a CRC calculated for the data message using all asserted bits as an initial code and using a CRC calculator having a number of bits equal to the number of bits of the data message; and calculating a CRC for the padded message using the seed code as an initial code and using a CRC calculator having a number of bits equal to the number of bits of the padded message.

26. The machine accessible medium of claim 25, wherein calculating the CRC for the padded message comprises:

looking up the seed code for the padded message in a table storing a plurality of seed codes for a plurality of different numbers of padding bits; and identifying an appropriate seed code corresponding to the at least one padding bit.

27. The machine accessible medium of claim 25, further comprising instructions to cause a machine to:

append the CRC for the padded message to the most significant bit position of the data message.

* * * * *